July 19, 1966 F. J. BOYLE 3,262,023

ELECTRICAL CIRCUIT ASSEMBLY HAVING WAFERS MOUNTED IN STACKED RELATION

Filed March 19, 1964 2 Sheets-Sheet 1

INVENTOR
FRANK J. BOYLE

BY

ATTORNEY

July 19, 1966 F. J. BOYLE 3,262,023

ELECTRICAL CIRCUIT ASSEMBLY HAVING WAFERS MOUNTED IN STACKED RELATION

Filed March 19, 1964 2 Sheets-Sheet 2

INVENTOR
FRANK J. BOYLE
BY
Donald S. Cher
ATTORNEY

United States Patent Office 3,262,023

Patented July 19, 1966

3,262,023

ELECTRICAL CIRCUIT ASSEMBLY HAVING WAFERS MOUNTED IN STACKED RELATION

Frank J. Boyle, Pitman, N.J., assignor to International Resistance Company, Philadelphia, Pa.

Filed Mar. 19, 1964, Ser. No. 353,055
1 Claim. (Cl. 317—101)

The present invention relates to an electrical circuit assembly, and more particularly to a miniaturized circuit assembly.

In the electronic industry, the trend is to miniaturizing electrical components and circuits. One type of miniaturized circuit which has been recently developed is known as an integrated circuit. An integrated circuit is a complete circuit in which the various active and passive electrical elements, such as resistors, capacitors, transistors and diodes, and the interconnecting conductive paths are fabricated on a single silicon wafer by a series of successive epitaxial and diffusion processes. Although such integrated circuits are very small in size, they have a number of limitations which limit their practical use. Such limitations include the types of circuits which can be made, the range and tolerances of the electrical values of the various electrical elements in the circuit, the power dissipation of the circuit, the operating voltages of the circuit, and the stability of the circuit. These limitations arise from the method that the integrated circuit is made, and the fact that all of the electrical elements of the circuit are formed in a very small area of a single wafer. In addition, such integrated circuits are relatively expensive, particularly when the quantity of any one circuit required is relatively small.

It is an object of the present invention to provide a novel miniaturized circuit assembly.

It is another object of the present invention to provide a miniaturized hybrid circuit assembly wherein the interconnecting conductive paths and some of the electrical elements are formed directly on a substrate wafer or wafers and others are individually secured to the wafer or wafers.

It is still another object of the present invention to provide a miniaturized hybrid circuit assembly which permits the formation of most existing circuits.

It is a further object of the present invention to provide a miniaturized hybrid circuit assembly which is mechanically and electrically stable, can include a relatively wide range of close tolerance electrical elements, and has a relatively high power dissipation for its size so as to permit higher operating voltages.

It is a still further object of the present invention to provide a miniaturized hybrid circuit assembly which is relatively inexpensive to manufacture even in small quantities.

For the purpose of illustrating the invention there is shown in the drawings a form which is presently preferred; it being understood, however, that this invention is not limited to the precise arrangements and instrumentalities shown.

Figure 1:
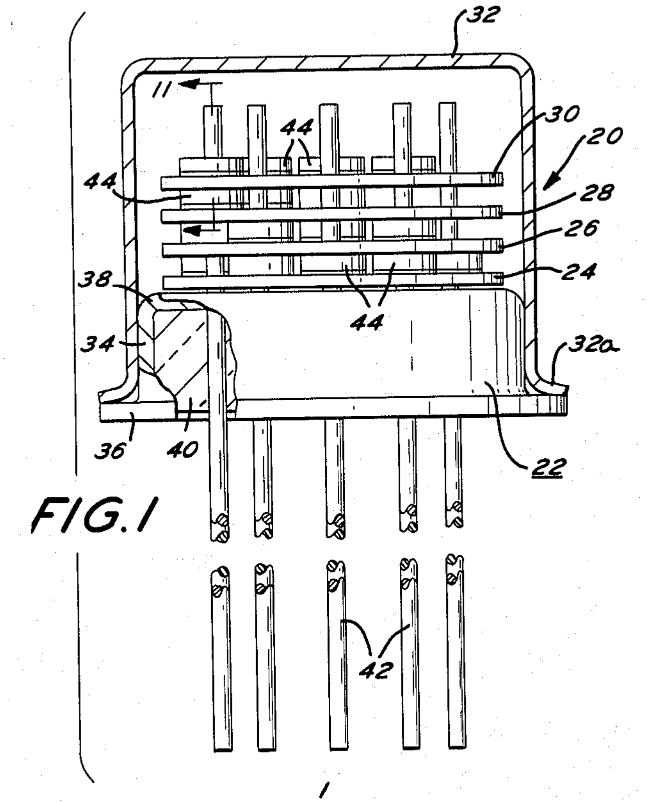
FIGURE 1 is a sectional view of the electrical circuit assembly of the present invention.

Referring initially to FIGURE 1 of the drawing, the electrical circuit assembly of the present invention is generally designated as 20. Circuit assembly 20 comprises a terminal header 22, four circuit wafers 24, 26, 28 and 30 mounted on the header 22, and a cover 32 secured to the header 22 and enclosing the circuit wafers.

Header 22 comprises a cylindrical metal ring 34 having a radially outwardly extending flange 36 at its bottom end and a radially inwardly extending flange 38 at its top end. A glass disc 40 is secured within the metal ring 34. Ten parallel terminal wires 42 extend through and are secured to the glass disc 40. The terminal wires 42 are arranged in a circle, and are uniformly spaced apart. The portions of the terminal wires 42 which project above the glass disc 40 are of uniform length and are shorter than the depth of the cover 32.

Figure 7:
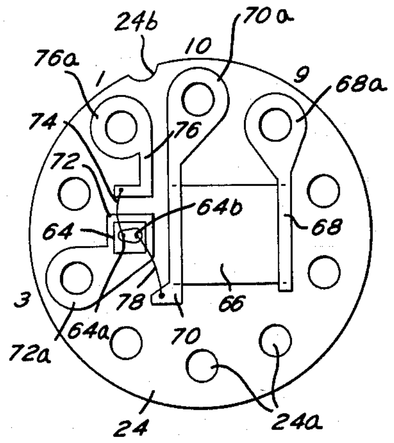
FIGURES 7, 8, 9 and 10 are top plan views of the wafers of the assembly of the present invention.
Figure 8:
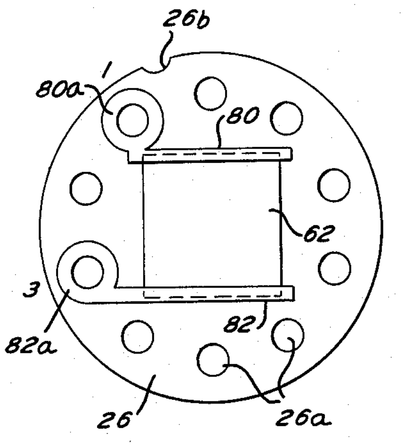
Figure 9:
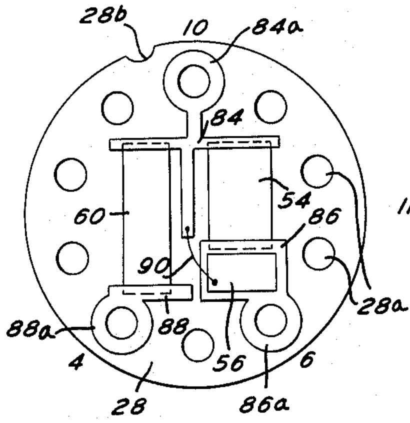
Figure 10:
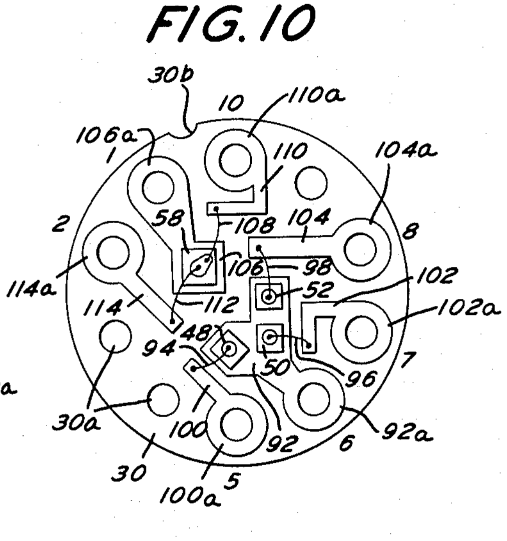

Each of the wafers 24, 26, 28 and 30 is a circular, thin, flat disc of a ceramic material. The diameter of each of the wafers is greater than the diameter of the circle formed by the terminal leads 42 but smaller than the diameter of the metal ring 34. As shown in FIGURE 7, the bottommost wafer 24 has ten holes **24*a* therethrough. The holes 24*a* are of a diameter slightly greater than the diameter of the terminal wires 42, and are uniformly spaced around a circle corresponding to the circle formed by the terminal wires. A notch 24*b* is provided in the edge of the wafer 24 between two of the holes 24*a*. As shown in FIGURES 8, 9 and 10, the wafers 26, 28 and 30 have similar holes 26*a*, 28*a* and 30*a* therethrough, and similar notches 26*b*, 28*b* and 30*b*** therein. As will be explained in detail later, each of the wafers has various electrical elements and conductive interconnections thereon.

Figure 11:
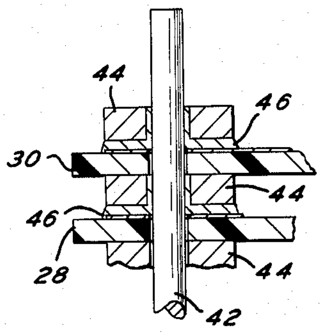
FIGURE 11 is a sectional view taken along line 11—11 of FIGURE 1.

Referring again to FIGURE 1, the wafers 24, 26, 28 and 30 are mounted in closely spaced, stacked relation on the header 22 with the terminal wires 42 extending through the holes **24*a*, 26*a*, 28*a* and 30*a* in the wafers. The wafers are arranged on the terminal wires 42 with the notches 24*b*, 26*b*, 28*b* and 30*b* in the wafers being in vertical alignment. Mounted on the terminal wires 42 between the wafers 24, 26, 28 and 30, and the above the wafer 30 are washers 44 of an electrically conductive metal, such as copper. As shown in FIGURE 11, each of the washers 44 is coated on its bottom surface and its inner cylindrical surface with a layer 46 of solder. As will be explained in detail later, the washers 44** serve a number of purposes which include mechanically securing the wafers to the terminal wires, electrically connecting the circuit elements on the wafers to the terminal wires, and porperly spacing the wafers.

The cover 32 is cup-shaped, and has an annular, radially outwardly extending flange **32*a* on its free edge. The cover 32 fits over the wafers and the header 22 with the cover flange 32*a* being seated on the flange 36 of the header. The flange 32*a* is welded to the flange 36 to secure the cover 32 to the header 22. Prior to welding the cover to the header, the interior of the assembly 20** can be either evacuated or filled with an inert gas.

Figure 2:
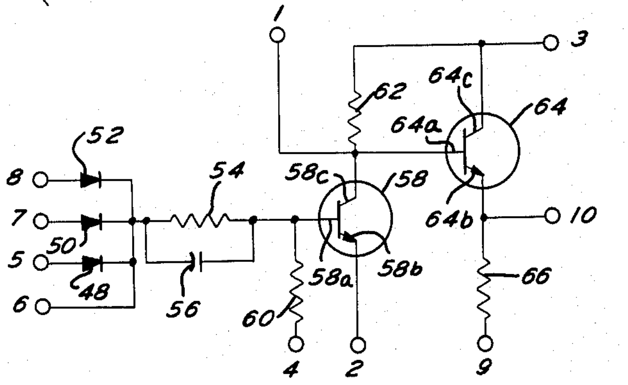
FIGURE 2 is a circuit diagram of a typical circuit which can be formed by the assembly of the present invention.

Referring to FIGURE 2, there is shown a circuit which can be provided by the assembly 20 of the present invention. The particular circuit shown is a NOR gate logic circuit. However, it should be understood that this particular circuit is merely illustrated as an example to permit a clear description of the manner of forming a circuit on the assembly 20, and that most other existing circuits can be provided by the assembly 20 in a similar manner.

The NOR gate logic circuit shown in FIGURE 2 comprises three diodes 48, 50 and 52 connected in parallel between individual terminals 5, 7 and 8 and a terminal 6. A resistor 54 and capacitor 56 are connected in parallel between the terminal 6 and the base electrode **58*a* of a transistor 58. A resistor 60 is connected between a terminal 4 and the base electrode 58*a* of transistor 58. The emitter electrode 58*b* of transistor 58** is connected to a terminal 2, and the collector electrode 58*c* is connected to a terminal 1. A resistor 62 is connected between the terminal 1 and a terminal 3. The base electrode 64*a* of a transistor 64 is connected to the terminal 1. The emitter electrode 64*b* of transistor 64 is connected to a terminal 10, and the collector electrode is connected to the terminal 3. A resistor 66 is connected between terminal 9 and terminal 10.

FIGURES 3–6 are schematic views of the wafers 24, 26, 28 and 30 showing which of the circuit elements are formed on each of the wafers. FIGURES 7–10 are top plan views of the wafers 24, 26, 28 and 30 showing the actual manner of forming the circuit elements and their conductive interconnections. In FIGURES 3–10, the holes in each of the wafers are numbered from 1 through 10 counterclockwise starting with the hole to the left of the notch in the wafer. The numbers of the holes in the wafers correspond to the numbers of the terminals of the circuit shown in FIGURE 2.

Figure 3:
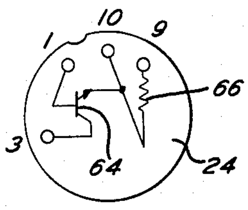
FIGURES 3, 4, 5 and 6 are schematic views of the various portions of the circuit formed on the wafers of the assembly.

As shown in FIGURE 3, the transistor 64 and resistor 66 are formed on the bottommost wafer 24. The transistor 64 and resistor 66 are provided with conductive interconnections to the holes 1, 3, 9 and 10. As shown in FIGURE 7, the resistor 66 comprises a rectangular layer of any suitable resistance material well known in the art coated on the wafer 24. The electrical characteristics of the resistor 66 depend on the area, thickness and composition of the resistance material layer. The resistance material layer of resistor 66 extends between and contacts interconnecting strips 68 and 70. Interconnecting strips 68 and 70, as well as all other such strips as will be described, are layers of an electrically conductive metal, such as silver, coated on the surface of the wafer. The interconnecting strips 68 and 70 extend to holes 9 and 10, and terminate in annular pads 68*a* and 70*a* which surround the holes 9 and 10.

Transistor 64 is a standard transistor element of a construction well known in the art. Such a transistor comprises a chip of a semi-conductor material, such as silicon, having diffused or alloyed junction forming the base, emitter and collector electrodes. Transistor 64 has the collector electrode 64*c* formed on one surface of the chip and the base electrode 64*a* and emitter electrode 64*b* formed on the other surface of the chip. The transistor 64 is mounted on the wafer 24 with the collector electrode 64*c* seated on and secured to an interconnecting strip 72, such as by soldering. The interconnecting strip has a terminal pad 72*a* surrounding the hole 3. A fine wire 74 is soldered or welded at one end to the base electrode 64*a* of the transistor 64, and soldered or welded at its other end to an interconnecting strip 76. Interconnecting strip 76 has a terminal pad 76*a* surrounding the hole 1. A fine wire 78 is secured at one end to the emitter electrode 64*b* of the transistor, and is secured at the other end to the interconnecting strip 70.

Figure 4:
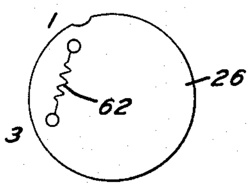

As shown in FIGURE 4, the wafer 26 has the resistor 62 formed thereon, and interconnection for the resistor 62 to the holes 1 and 3. As shown in FIGURE 8, resistor 62 is a layer of suitable resistance material coated on the surface of the wafer 26. Resistor 62 extends between interconnecting strips 80 and 82. Interconnecting strip 80 has a terminal pad 80*a* surrounding the hole 1, and interconnecting strip 82 has a terminal pad 82*a* surrounding the hole 3.

Figure 5:
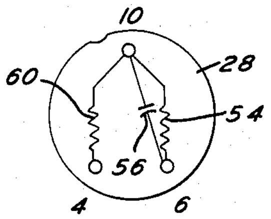

As shown in FIGURE 5, wafer 28 has the resistor 54, resistor 60 and capacitor 56 formed thereon. Interconnections are provided to connect the resistor 54 and capacitor 56 in parallel between the holes 10 and 6, and to connect the resistor 60 between holes 10 and 4. As shown in FIGURE 9, the resisors 54 and 60 are each layers of a resistance material coated on the surface of the wafer 28. Resistors 54 and 60 extend between interconnecting strip 84 and interconnecting strips 86 and 88, respectively. Interconnecting strip 84 has a terminal pad 84*a* surrounding hole 10, interconnecting strip 86 has a terminal pad 86*a* surrounding hole 6, and interconnecting strip 88 has a terminal pad 88*a* surrounding hole 4. Capacitor 56 is a standard disc type capacitor of a construction well known in the art. Such a capacitor comprises a disc of a high dielectric constant material having an electrically conductive coating on the opposite surfaces thereof to provide the plates of the capacitor. Capacitor 56 is mounted on the wafer 28 with one of its plates seated on and secured to the interconnecting strip 86. A fine wire 90 is connected between the other plate of capacitor 56 and the interconnecting strip 84.

Figure 6:
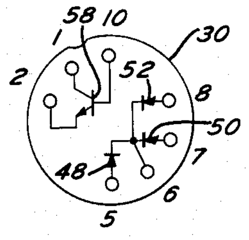

As shown in FIGURE 6, wafer 30 has the three diodes 48, 50 and 52, and the transistor 58 formed thereon. Interconnections are provided between the electrodes of transistors 58 and holes 1, 2, and 10, and between the diodes 48, 50 and 52 and holes 5, 6, 7 and 8. Diodes 48, 50 and 52 are standard semiconductor diode elements of a construction well known in the art. Such a diode comprises a chip of a semiconductor material, such as silicon, having a diffused or alloy junction thereon and a pair of electrodes on opposite sides of the junction. Transistor 58 is of a construction similar to that of transistor 64 previously described.

As shown in FIGURE 10, the diodes 48, 50 and 52 are mounted on the wafer 30 with their common electrodes seated on and secured to an interconnecting strip 92 which has a terminal pad 92*a* surrounding hole 6. Fine wires 94, 96 and 98 connect the other electrodes of the diodes 48, 50 and 52 respectively to interconnecting strips 100, 102 and 104 respectively. Interconnecting strips 100, 102 and 104 have terminal pads 100*a*, 102*a* and 104*a* respectively surrounding holes 5, 7 and 8 respectively. Transistor 58 is mounted on wafer 30 with the collector electrode 58*c* seated on and secured to an interconnecting strip 106 which has a terminal pad 106*a* surrounding hole 1. A fine wire 108 connects the base electrode 58*a* to an interconnecting strip 110, and a fine wire 112 connects the emitter electrode 58*b* to an interconnecting strip 114. Interconnecting strips 110 and 114 have terminal pads 110*a* and 114*a* respectively surrounding holes 10 and 2 respectively.

In the assembling of the circuit assembly 20, the wafer 24 is first mounted on the header 22 with the electrical elements thereon facing upwardly and with the terminal wires 42 extending through the holes in the wafer. Separate washers 44 are then mounted on the terminal wires which extend through holes 1, 3, 9 and 10. The washers 44 are positioned with the solder layers 46 thereon facing the wafer 24 so that the solder layers engage the terminal pads 76*a*, 72*a*, 68*a* and 70*a*. Additional washers 44 are mounted either on all of the other terminal wires, or at least on the terminal wires extending through holes 5 and 7. The wafer 26 is then similarly mounted on the header 22 over the wafer 24 with the bottom surface of wafer 26 seated on the washers 44. The additional washers which were mounted on the wafer 24 are required to properly support the entire periphery of wafer 26 in spaced relation from wafer 24. Washers 44 are then mounted on the wafer 26 around the terminal wires extending through holes 1 and 3 and such other of the terminal wires as to provide the proper support for wafer 28. After wafer 28 is mounted on the header 22, washers 44 are mounted on the wafer 28 around the terminal wires which extend through holes 4, 6 and 10 and such other terminal wires as is necessary to properly support wafer 30. Above wafer 30, washers 44 are mounted around the terminal wires extending through holes 1, 2, 5, 6, 7, 8 and 10.

After all the wafers and washers are mounted on the headers 22, the assembly is heated to melt the solder layer 46 on the washers 44, and thereby bond the washers to the various terminal pads on the wafers and to the terminal wires 42. The various electrical elements on the wafers are then electrically connected together and to the terminal wires 42 through the washers 44 to form the circuit shown in FIGURE 2. It should be noted that the terminal wire 42 which extends through the holes 10 in the wafers electrically connects the emitter electrode **64*b* of the transistor 64 and the resistor 66 to the terminal 10 as well as provides the intercircuit electrical connection between the base electrode 58*a* of transistor 58, the resistors 54 and 60 and the capacitor 56. To properly provide both connections, the terminal wire 42 which extends through the holes 10 is cut completely through either between the wafers 24 and 26 or between the wafers 26 and 28. Thus, any of the terminal wires 42** can function as both a terminal for the circuit and as an intercircuit connection between various electrical elements.

In the circuit assembly 20 of the present invention, the washers 44 serve many important functions which both improve the characteristics of the assembly 20, and advantageously affect the ease of making the assembly so as to reduce the cost thereof. As has been previously stated, the washers 44 provide the mechanical connection between the wafers and the terminal wires and the electrical connections between the various electrical elements and the terminal wires. With the use of the washers 44 all of the mechanical and electrical connections can be made simultaneously by merely heating the entire assembly prior to placing the cover 32 thereon. This permits a mechanization of this step in the assembling of the assembly 20 as to reduce the cost thereof. The washers 44 also provide for ease of mounting the wafers on the header in properly spaced relation so as to reduce the time and cost of the assembling operation. Proper spacing between the wafers is required not only to prevent damage to the electrical elements and the fine wire connections on the wafers, but to provide for adequate heat dissipation. In addition, the washers 44 provide a more rigid assembly in that all of the wafers are firmly seated and supported on the header 22.

Another important function of the washers 44 is that they prevent any short circuiting, open circuiting or damage to the various electrical elements during the soldering operation. For a miniaturized circuit assembly 20 of the present invention, the wafers are very small, slightly less than ¼ inch in diameter. Thus, on each of the wafers, adjacent terminal pads are very close together, and are close to the various electrical elements and fine wire connections on the wafers. Also, the transistors, diodes, capacitors and fine wire connectors are so small that they must be mounted on the wafers under a microscope. Thus, during the soldering operation, if the solder flowed away from the terminal pads, the solder could cause a short circuit between adjacent terminal pads, or could contact and break the fine wires so as to cause an open circuit, or could damage the electrical elements. However, it has been found that by using the solder coated washers 44, the washers provide a capillary action which prevents the flow of the solder beyond the edges of the terminal pads. Thus, the soldering operation can be easily carried out without any damage to the assembly.

Thus there is provided by the present invention an electrical circuit assembly which can be made in very small sizes in the form of almost any existing circuit containing active and passive electrical elements and interconnections therebetween. The circuit assembly can be made as small as approximately ⅓ inch in diameter and ¼ inch high with the terminal wire being arranged for ease of mounting the assembly on a printed circuit board or connection to other similar assemblies or other electrical devices to form a more complex circuit. The circuit assembly of the present invention includes discrete electrical elements which can be obtained in a wide range of close tolerance electrical values as to achieve a circuit which is electrically stable. Also, the construction of the circuit assembly provides for good heat dissipation so as to provide for relatively high operating voltages for the size of the assembly. In addition, the circuit assembly is of a rigid construction so as to be mechanically stable. Although the circuit assembly 20 of the present invention is shown and described as having ten terminal wires and four circuit wafers, the assembly can include any desired number of the terminal wires and circuit wafers depending on the particular circuit being provided by the assembly. Because of the great flexibility in the circuits which can be provided by the assembly of the present invention, the flexibility in the electrical elements which can be used in the circuit, and the ease of assembling the assembly, the circuit assembly of the present invention is relatively inexpensive to manufacture as compared to other types of miniaturized circuits.

The present invention may be embodied in other specific forms without departing from the spirit or essential attributes thereof and, accordingly, reference should be made to the appended claim, rather than to the foregoing specification as indicating the scope of the invention.

I claim:

An electrical circuit assembly comprising a header having a plurality of spaced parallel terminal wires extending therethrough and secured thereto, a plurality of flat wafers of an electrically insulating material, each of said wafers having a plurality of holes therethrough equal in number to the number of said terminal wires, at least one electrical element on each of said wafers, interconnecting strips of an electrically conductive material coated on a surface of each of said wafers, each of said strips extending from an electrical element to a separate one of the holes in the wafer and having a terminal pad surrounding the hole, said wafers being mounted in stacked relation on said header with the terminal wires extending through the holes in the wafers, metal washers sandwiched between said wafers and firmly supporting the wafers in spaced relation, each of said washers surrounding a separate terminal wire and being seated on a terminal pad of an adjacent wafer, additional metal washers surrounding the terminal wires and seated on the terminal pads on the uppermost of the wafers, each of said washers having a layer of solder coated on its inner surface and its surface which is seated on a terminal pad, and the washers being bonded by said solder to the terminal wires and terminal pads so as to mechanically secure the wafers to the terminal wires and electrically connect the electrical elements to the terminal wires.

References Cited by the Examiner

UNITED STATES PATENTS

| | | | |
|---|---|---|---|
| 3,136,050 | 6/1964 | Trueb et al. | 174—50.5 X |
| 3,179,913 | 4/1965 | Mittler et al. | 174—68.5 X |
| 3,205,297 | 9/1965 | Brock | 174—68.5 |

OTHER REFERENCES

Keonjian, Microelectronics, Theory, Design, and Fabrication, McGraw-Hill Book Co., Inc., 1963, published June 26, 1963, page 166, Figs. 3–41, page 167, Figs. 3–43 and page 298, Figs. 5–22.

ROBERT K. SCHAEFER, *Primary Examiner.*

KATHLEEN H. CLAFFY, *Examiner.*

M. GINSBURG, *Assistant Examiner.*